(12) United States Patent
Jeddeloh

(10) Patent No.: US 6,857,055 B2
(45) Date of Patent: Feb. 15, 2005

(54) PROGRAMMABLE EMBEDDED DRAM CURRENT MONITOR

(75) Inventor: Joseph M. Jeddeloh, Shoreview, MN (US)

(73) Assignee: Micron Technology Inc., Boise, ID (US)

(*) Notice: Subject to any disclaimer, the term of this patent is extended or adjusted under 35 U.S.C. 154(b) by 303 days.

(21) Appl. No.: 10/218,586

(22) Filed: Aug. 15, 2002

(65) Prior Publication Data
US 2004/0034749 A1 Feb. 19, 2004

(51) Int. Cl.⁷ .............................................. G06F 12/00
(52) U.S. Cl. ..................... 711/163; 711/154; 713/304; 365/226; 365/230.6; 361/91.1; 361/93.9
(58) Field of Search ......................... 711/163; 713/340; 365/226, 230.06; 361/91.1, 93.9

(56) References Cited

U.S. PATENT DOCUMENTS 6,529,440 B2 * 3/2003 Kitamoto et al. ...... 365/230.06
6,535,449 B2 * 3/2003 Miyauchi .................... 365/227
2003/0156448 A1 * 8/2003 Hidaka ....................... 365/171

* cited by examiner

Primary Examiner—Donald Sparks
Assistant Examiner—Ngoc Dinh
(74) Attorney, Agent, or Firm—Dickstein Shapiro Morin & Oshinsky LLP (57) ABSTRACT

This invention provides a method and apparatus for controlling the current drawn in a multi-bank memory device, for example, in a multi-bank memory system. The above and other features and advantages of the invention are achieved by a method and apparatus which controls access to a memory device to prevent an over-current condition. Each memory request is processed for each memory bank as an arbitrated event. A request is coordinated with the local memory controller circuitry controlling access to the memory bank. The memory bank is checked for its availability. The total current demand of the memory device is determined. If the memory bank request would not create an over-current condition and the memory bank is available, then the memory bank request is acknowledged and the memory request is carried out. Also provided is a method of fabricating such a memory device and also a method of operating such a memory device to access a selected memory bank.

52 Claims, 5 Drawing Sheets

PROGRAMMABLE EMBEDDED DRAM CURRENT MONITOR

This invention relates generally to circuitry and protocols for controlling current consumption conditions in a multi bank memory device.

BACKGROUND OF INVENTION

The typical memory contains an array of memory cells connected to each other by row and column lines. Each memory cell stores a single bit and is accessed by a memory address that includes a row address that indexes a row of the memory array and a column address that indexes a column of the memory array. Accordingly, each memory address points to the memory cell at the intersection of the row specified by the row address and the column specified by the column address.

In a typical computer system, the system processor communicates with the computer memory via a processor bus and a memory controller. For example, a central processing unit (CPU) issues a command and an address, which are received and translated by the memory controller. The memory controller, in turn, applies appropriate command signals and row and column addresses to the memory device. Examples of such commands include a row address strobe (RAS), column address strobe (CAS), write enable (WE), and, for some memory devices, a clock signal (CLK). In response to the commands and addresses, data is transferred between the CPU and the memory device.

The computer memory device typically includes a dynamic random access memory (DRAM) module, for example, a single in-line memory module (SIMM) or a dual in-line memory module (DIMM). The memory module contains memory devices having one or more banks of memory chips connected in parallel such that each memory bank stores one word of data per memory address.

In an attempt to decrease memory access time, a faster form of memory, referred to as synchronous DRAM (SDRAM), was created. SDRAM transfers data with the use of a clock signal. By contrast, prior DRAM devices were asynchronous because they did not require a clock input signal for data transfer. The memory controller for synchronous devices receives the system clock signal and operates as a synchronous interface with the CPU so that data is exchanged with the CPU at appropriate edges of the clock signal.

SDRAMs offer substantial advances in DRAM operating performance, including the ability to synchronously burst data at a high data rate with automatic column-address generation, the ability to interleave between internal data banks in order to hide precharged time, and the capability to change column addresses on each clock cycle during a burst access.

As the speed of memory devices such as the SDRAM increases, (e.g., as such SDRAM devices are operated at faster clock rates) and as multiple memory banks are contemporaneously being accessed (e.g., for read, write, refreshing operations, etc.), the current demands on such systems significantly increases and can lead to over-current conditions. An over-current condition may cause electrical shorts, damage or unpredictable results in a memory device. Therefore, the current demand of a memory device needs to be better controlled.

An efficient memory current controller which facilitates the communication of the memory requests to the memory devices while limiting memory device over-current conditions is needed.

BRIEF SUMMARY OF INVENTION

This invention provides a method and apparatus for controlling the current drawn in a multi-bank memory device, for example, in a multi-bank memory system.

The above and other features and advantages of the invention are achieved by a method and apparatus which controls access to a memory device to prevent an over-current condition. Each memory request is processed for each memory bank as an arbitrated event. A request is coordinated with the local memory controller circuitry controlling access to the memory bank. The memory bank is checked for its availability. The total current demand of the memory device is determined. If the memory bank request would not create an over-current condition and the memory bank is available, then the memory bank request is acknowledged and the memory request is carried out. Also provided is a method of fabricating such a memory device and also a method of operating such a memory device to access a selected memory bank.

BRIEF DESCRIPTION OF DRAWINGS

These and other features and advantages will become more apparent from the following detailed description of the invention that is provided in conjunction with the accompanying drawings.

DETAILED DESCRIPTION OF INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
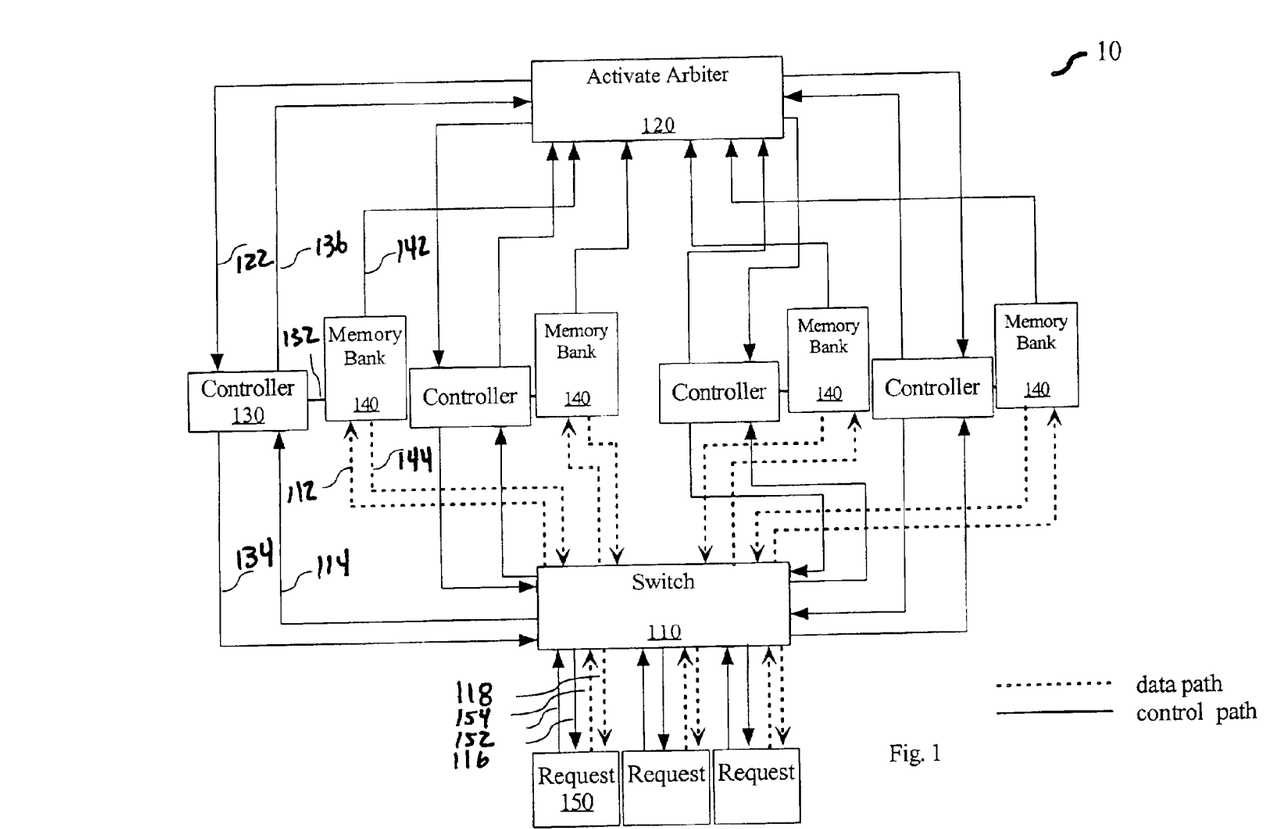
FIG. 1 is a high-level block diagram illustrating a memory bank current monitor logic device in accordance with an exemplary embodiment of the present invention.

FIG. 1 is a high level diagram illustrating a memory bank current monitor logic device 10 in accordance with an exemplary embodiment of the present invention. A circuit is used to control access to memory banks primarily dependent on the current condition of the collective memory banks 140. A switch 110 is combined with multiple memory banks (e.g., 140) within the memory device 10. The switch 110 controls and routes requests (e.g., 150) to the appropriate memory bank 140. Each memory bank 140 has its own local memory controller (e.g., 130) which monitors the state of the memory bank 140 and coordinates memory access to the memory bank 140 with the switch 110 and the activate arbiter 120. The activate arbiter 120 monitors the current condition of the collective memory banks 140 within the memory device 10 and controls access of a memory request 150 to a memory bank 140.

A requestor that generates the requests (e.g., 150) is a function or process that desires access to a memory bank 140 for either a read, write or refresh operation. For example, a requester may be other logical elements of an electronic system such as the central processing unit (CPU), arithmetic logical unit (ALU), etc. Each requestor may submit one or more different requests 150 for access to one or different memory banks 140. The number of requests 150 that may be simultaneously processed may be limited by the physical characteristics of the memory device 10 or by design. Signal and data path lines 152, 154, 116, 118 couple a request 150 to the switch 110. The conductive signal lines 152 and 116 represent the communication pathways and are used for the 'Request-Acknowledge' process, which is described more fully below. The data lines 154 and 118 represents the data path for data flow between the request 150 and the switch 110. Although four different conductive lines 116, 118, 152, 154 are shown in FIG. 1, it should be readily apparent that any number of lines may be used depending on the specific character of the lines and the architecture of the device.

Still referring to FIG. 1, the switch 110 receives a request 150 from a requestor (the function, circuit, or process requesting access to the memory bank 140) for access to memory bank 140. The switch 110 determines the status of the desired memory bank 140 by polling the local memory controller 130 coupled to the desired memory device 140 via communication paths 114, 134. If the local memory controller 130 indicates BUSY (indicating that the associated memory bank 140 is activated) then the switch 110 waits until the local memory controller 130 does not indicate BUSY before sending a REQUEST (controller) signal to the local memory controller 130, but continues to process other pending requests 150.

The switch 110 'tags,' (i.e., adds identification information to) the communication REQUEST (controller) signal so as to identify it as originating from request 150 and that it requests access to memory bank 140. This tag information is utilized by the switch 110 to match an acknowledged REQUEST (controller) from the local memory controller 130 to its corresponding request 150. When the switch 110 receives an ACKNOWLEDGE (controller) signal from the local memory controller 130, switch 110 determines the corresponding request 150 and then communicates an ACKNOWLEDGE (request) with the requester corresponding to the match and awaits an acknowledgement signal from the requestor. Once an acknowledgement is received from the requester, the switch 110 establishes a data path connection between the requestor corresponding to the request 150 and the requested memory bank 140 through data paths 154, 112, 144, and 118. Although four different conductive lines 154, 112, 144, and 118 are shown in FIG. 1, it should be readily apparent that any number of conductive lines may be used.

The local memory controller 130 serves as the local memory controller to a respective memory bank 140. The local memory controller 130 monitors the status (i.e., whether it is activated or not) of the memory bank 140 through communication pathway 132. The local memory controller 130 also communicates with the activate arbiter 120 through communication pathways 122, 136 and with switch 110 through communication pathways 134, 114. As described above, local memory controller 130 provides control access and information to the switch 110 for a request 150 for a corresponding memory bank 140. If the memory bank 140 is already activated (e.g., performing a refresh operation, a read operation, a write operation, etc.) then a BUSY signal is enabled, and communicated to the switch 110 through line 134. If the local memory controller 130 determines that the memory bank 140 is not already activated, then a BUSY signal communicated to the switch 110 is not enabled.

When a local memory controller 130 receives a REQUEST (controller) for memory access from the switch 110, then the local memory controller 130 polls the communication line 122 from the arbiter 120. If the controller 130 is not receiving an ACCESS signal from the arbiter 120, via signal path 122, then the local memory controller 130 sends a REQUEST (arbiter) signal to the arbiter 120 via signal path 136 and awaits an ACKNOWLEDGE (arbiter) signal via signal path 122. When the arbiter 120 grants access to the memory bank 140, (e.g., by enabling an ACCESS signal or by acknowledging the REQUEST (arbiter) by sending an ACKNOWLEDGE (arbiter) signal to the local memory controller 130), then the local memory controller 130 sends an ACKNOWLEDGE (controller) signal to the switch 110. Although two respective pairs of conductive lines 122, 136 and 134, 114 are shown in FIG. 1, it should be readily apparent that a number of lines may be used.

In a preferred embodiment, a memory device 10 is an embedded DRAM in a plurality of DRAM memory banks 140. A memory bank 140 draws a particular amount of current depending on the state of the memory bank 140, i.e., depending on whether the memory bank 140 is being accessed to be read from or written to, or if the memory bank 140 is being refreshed. Memory bank 140 is coupled to both the local memory controller 130 and the arbiter 120.

The activate arbiter 120 monitors the current condition of the collective memory banks 140 within the memory device 10 and determines the access for a memory request 150 to a memory bank 140. The arbiter 120 operates in two conditions: over-current and under-current. If the arbiter 120 determines that the current consumption of the memory device is below a certain predetermined current value, it generates an ACCESS signal, which permits the local memory controllers 130 to access the memory banks 140. If, on the other hand, arbiter 120 determines that a requestor accessing a given memory bank 140 creates an over-current condition (e.g., the current consumption is equal to, or greater than, a predetermined current value) then it will not generate an ACCESS signal to local memory controller 130 and the local memory controller 130 will have to submit a REQUEST (arbiter) to the arbiter 1204 before being granted access to a memory bank 140. Once arbiter 120 determines that the current consumption value is lower than the predetermined current value, then the arbiter 120 proceeds to process any pending requests from the local memory controllers 130 and acknowledge these requests when appropriate by sending an ACKNOWLEDGE (arbiter) signal to the local memory controller 130. Once all the pending requests have been processed and arbiter 120 determines that the memory device 10 is in an under-current condition, then the arbiter 120 generates an ACCESS signal and transmits the signal to the controllers 130.

The activate arbiter 120 continuously monitors memory banks 140 through communication pathways 142 to determine the collective current draw of the memory banks 140. The order in which requests are granted by the activate arbiter 120 is based on a predetermined basis that may be a chronological, random, round robin, or some other ordering basis. When the activate arbiter 120 determines that a memory bank 140 may be accessed for activation, an ACKNOWLEDGE (arbiter) signal is then communicated to the respective local controller 130. In a preferred embodiment, the activate arbiter 120 loads a predetermined value for the over-current threshold from a computer system's Basic Input/Output System (BIOS) during initialization and the value may correspond to a specific current level or to a particular number of memory banks that may be activated simultaneously. Additionally, the activate arbiter 120 may load a predetermined ordering basis from the BIOS during initialization. Furthermore, the over-current value may be dependent on the existing power source of a system containing the present invention. For example, a computer system running on AC power may have a different over-current value than the same system running on DC power.

Figure 2:
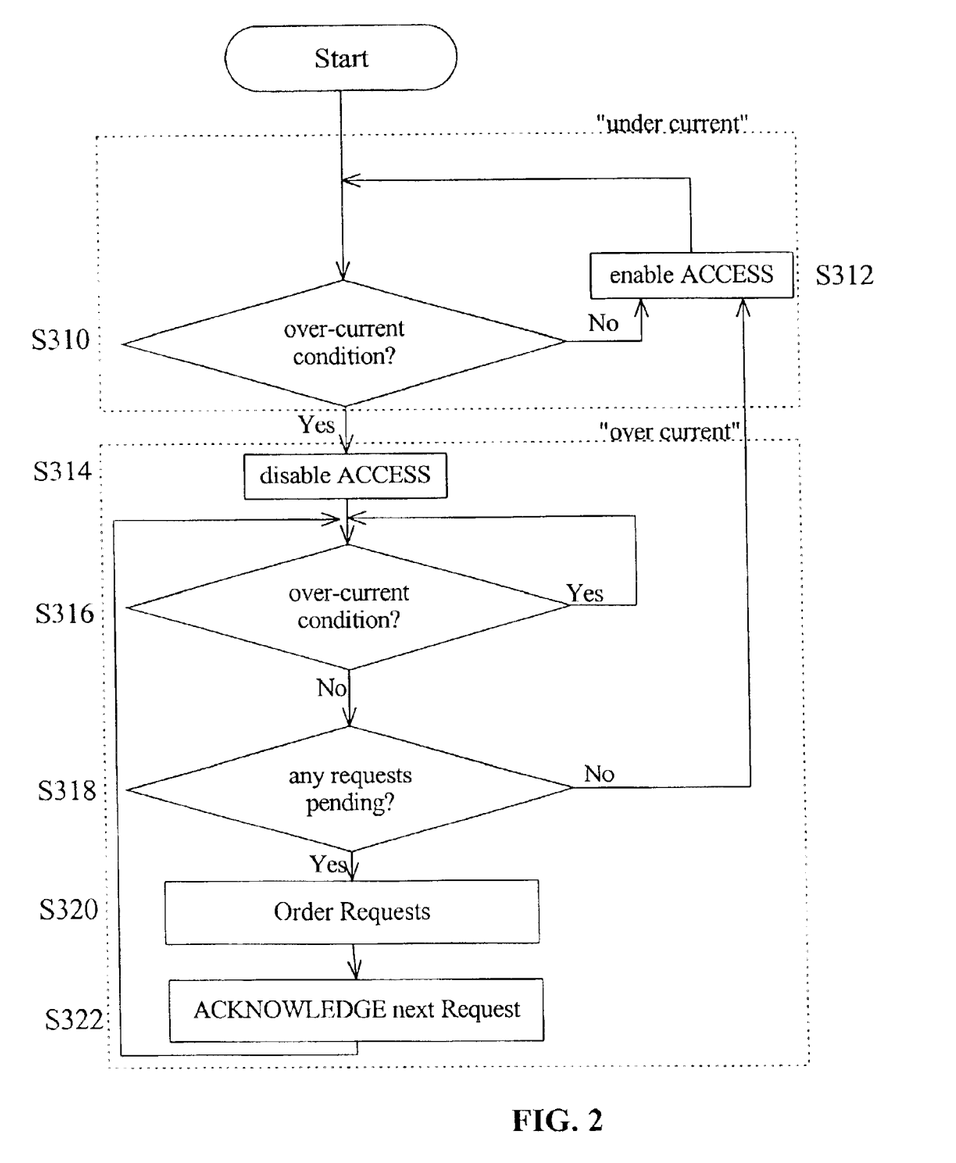
FIG. 2 is a flow chart depicting an operational flow of the Activate Arbiter of the FIG. 1 device, in accordance with an exemplary embodiment of the invention.

Turning now to FIG. 2, a flow chart is illustrated as depicting an operational flow of the Activate Arbiter of the FIG. 1 device, in accordance with an exemplary embodiment of the invention. As indicated above, the activate arbiter 120 operates in two conditions "under current" and "over current" as shown in FIG. 2. In a first process segment S310, the arbiter 120 determines the current condition. If an over-current condition is occurring then execution continues to process segment S314. If an over-current condition is not occurring then execution continues to process segment S312.

In process segment 312, the arbiter 120 enables an ACCESS signal permitting the local memory controllers 130 to access their respective memory banks 140 if the respective memory bank 140 is requested and if the respective memory bank 140 is not BUSY.

In process segment S314, the first segment in the "over current" condition, the arbiter 120 disables the ACCESS signal, therefore not permitting the local memory controllers 130 to access their respective memory banks 140.

In process segment S316, the arbiter 120 determines the current condition. If an over-current condition is occurring then execution loops back to process segment S316. If an over-current condition is not occurring then execution continues to process segment S318.

In process segment S318, the arbiter 120 determines if there are any pending requests from the local memory controllers 130 for access to a respective memory bank 140. If there are not any pending requests, execution then continues to S312 and the arbiter 120 leaves the "over current" state. If there are pending requests, then execution continues to S320.

In process segment S320, the arbiter 120 prioritizes the pending requests based on a predetermined basis. In S322 the arbiter 120 sends an ACKNOWLEDGE signal to the pending request that is determined in process segment S320 to be next. Execution continues to process segment S316.

As shown in FIG. 2, the arbiter 120 monitors current condition and processes pending requests at the same time that the other parts of the circuit 10 are separately processing requests and acknowledgements to those requests.

In another aspect of this embodiment, the switch 110 is configured to support variable burst lengths and burst types. The burst length determines the maximum number of consecutive column locations that can be accessed for a given READ or WRITE command without the need to use clock cycles to transfer subsequent intervening column addresses. A burst type provides for either sequential (e.g., in order) or interleaved (e.g., alternating) burst access.

Figure 3:
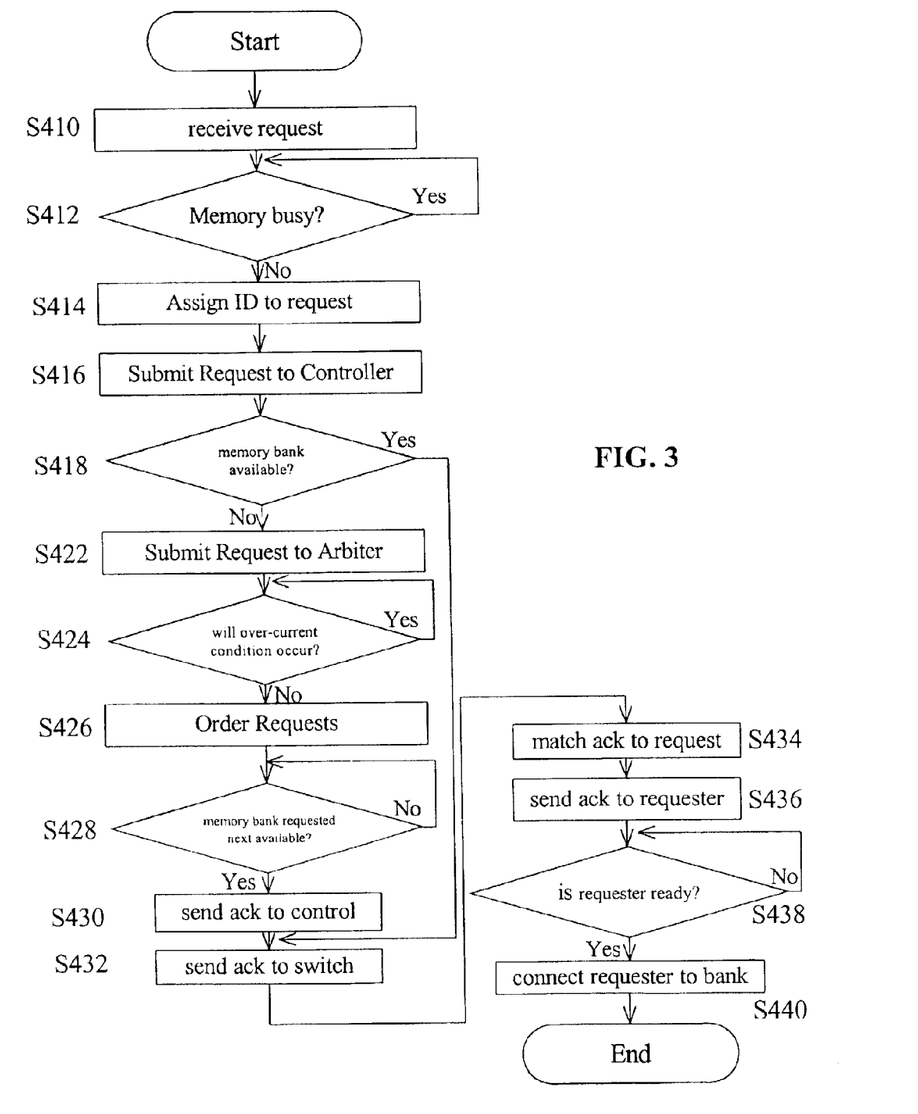
FIG. 3 is a flow chart depicting an operational flow of the FIG. 1 device, in accordance with an exemplary embodiment of the invention.

Turning now to FIG. 3, a flow chart depicting an operational flow of the FIG. 1 device is illustrated in accordance with an exemplary embodiment of the invention. In a first process segment S410, a request 150 (FIG. 1) is received by switch 110. In process segment S412, the switch 110 determines which memory bank 140 and which corresponding local memory controller 130 is being requested and determines whether that memory bank 140 is busy The switch 110 samples the communication pathway from that local memory controller 130. If the memory bank 140 is currently activated for a refresh, or read or write operation, then the memory bank 140 is BUSY as indicated by a signal sent from the local memory controller 130 to the switch 110. The request 150 is then placed in a buffer and the request is attempted later. At process segment S412, if there is not a BUSY signal on the communication pathway from the desired local memory controller 130, then the switch 110 assigns an identifier to the REQUEST (controller) that identifies it with the request 150 and the desired memory bank 140 at segment S414.

At segment S416, the switch 110 issues the REQUEST (controller) to the local memory controller 130 indicating a desire to access the memory bank 140. At segment S418, the local memory controller 130 determines if permission is granted by the arbiter 120 to access the memory bank 140, (i.e., the local memory controller 130 polls the communication pathways from arbiter 120 for an ACCESS signal).

The activate arbiter 120 continuously monitors the existing current demand by keeping track of memory banks 140 that are activated. If the arbiter 120 determines that an over-current condition will not occur with the requested memory access, the arbiter 120 sends a grant of permission, (i.e., an ACCESS signal is sent to the local memory controller 130) to access the memory bank 140. If local memory controller 130 determines that the arbiter 140 has granted permission to access the memory bank 140, i.e., that there is not an ACCESS signal from arbiter 120, then execution continues to process segment S432. If local memory controller 130 determines that the arbiter 140 has not granted permission to access the memory bank 140, e.g., no ACCESS signal, then execution continues to process segment S422.

In process segment S422, the local memory controller 130 sends a REQUEST (arbiter) signal to the arbiter 120 indicating its desire to access the memory bank 140. In process segment S426, if the arbiter 120 determines that the activation of the memory bank 140 will cause an over-current condition to occur, the execution loops back to segment S424. If it is determined, at segment S424, that no over-current conditions will occur with a memory access to memory bank 140 at segment S426, the arbiter 120 determines the order, based on a predetermined ordering method described above, of the request signals currently pending with the arbiter 120.

At process segment S428, the arbiter 120 determines, based on the results of segment S424 if the REQUEST (arbiter) signal is the next permissible signal. If it is, then execution continues to process segment S430. If the request signal is not the next signal to be processed, then execution returns to process segment S428.

If process segment S428 indicates an access to the memory bank is permitted then in process segment S430, the arbiter 120 sends an ACKNOWLEDGE (arbiter) signal to the local memory controller 130 granting access to the memory bank 140. At process segment S432, having received an access grant from arbiter 120 the local memory controller 130 sends an ACKNOWLEDGE (controller) signal to the switch 110. At process segment S434, the switch 110 matches the ACKNOWLEDGE (controller) signal with the original request 150.

At process segment S436, the switch 110 sends an ACKNOWLEDGE (requester) signal to the requester. At process segment S438, the switch 110 waits to receive an acknowledgement back from the requestor. When it does receive an acknowledgement, then execution continues to process segment S440, where the switch 110 connects the requestor to the requested memory bank 140.

The above-described method follows a single request 150 for access to a single memory bank 140. Similar requests for other memory banks occur contemporaneously. Furthermore, the activate arbiter 120 continuously monitors current consumption in the memory banks 140, independent of the process steps indicated above for a request to be granted.

Figure 4:
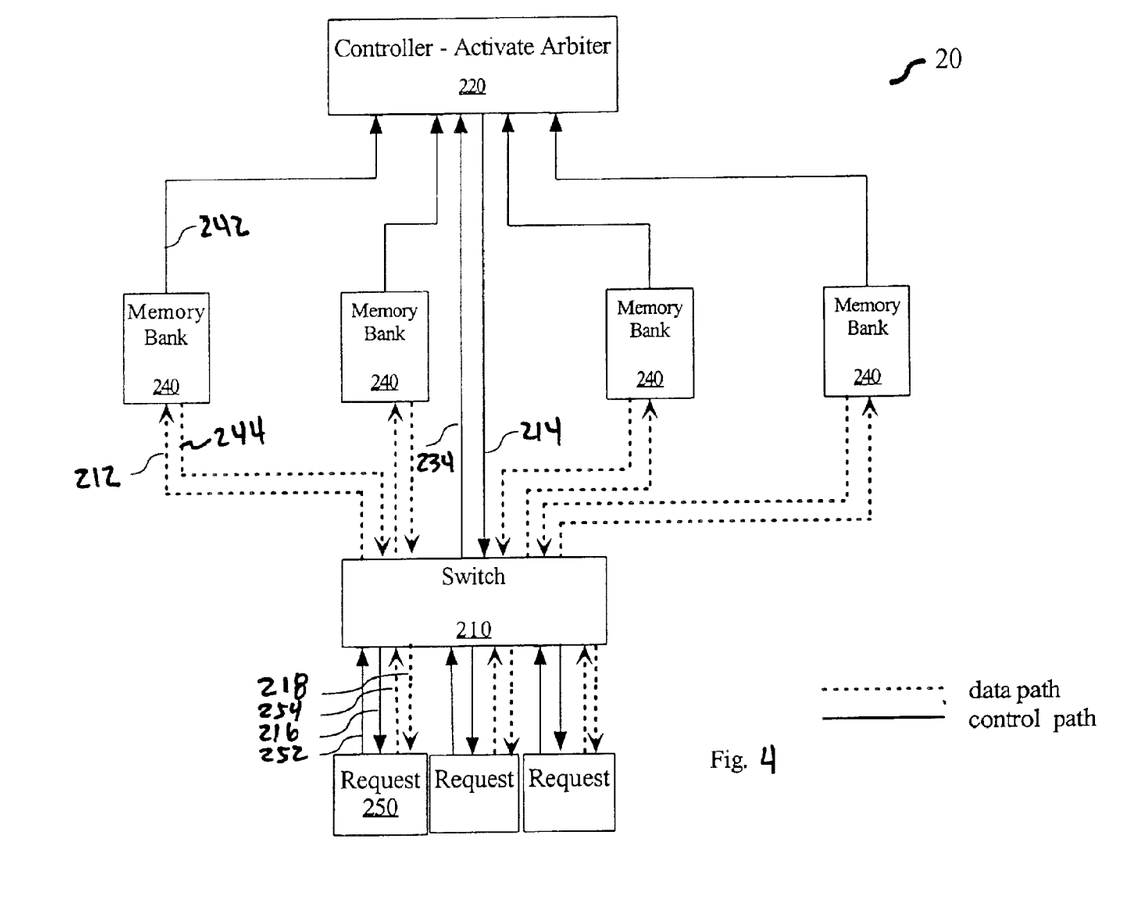
FIG. 4 is a high level block diagram illustrating a memory bank current monitor logic device in accordance with another exemplary embodiment of the present invention.

In an alternative embodiment, a system 20 without a local memory controller 130 for each memory bank 240 is shown in FIG. 4 which combines a switch 210 with multiple memory banks 240 and controller-activate arbiter (controller-arbiter) 220. In this approach, unlike the previous embodiment, no local memory controller is utilized and controller-arbiter 220 assumes the responsibilities of both the local memory controller 130 and arbiter 120 (FIG. 1). In this manner the switch 210 communicates and coordinates directly with the controller-arbiter 220 for access to a desired memory bank 240.

The switch 210 controls and routes requests 250 to the appropriate memory bank 240. The switch 210 receives a request 250 from a requestor (the function, circuit, or process requesting access to the memory bank 240) for access to memory bank 240. If the arbiter 220 indicates that the memory bank 240 is BUSY (indicating that the associated memory bank 240 is activated) then the switch 210 waits until the arbiter 220 indicates that the memory bank 240 is not busy before sending a memory access request to the arbiter 220, but continues to process other pending requests 250. The switch 210 requests access to a requested memory bank 240 by communicating with the arbiter for the requested memory bank 240 via communications pathways 234, 214.

The switch 210 'tags,' (i.e., adds identification information to) the communication signal that identifies the request 250 requesting memory bank 240 for use later. This tag information is utilized by the switch 210 to match an acknowledged request from the arbiter 220 to a request 250. When the switch 210 receives an ACKNOWLEDGE (arbiter) signal from the arbiter 220, switch 210 matches to request 250 communicates an ACKNOWLEDGE (requestor) to the requestor corresponding to the match and awaits an acknowledgement signal back from the requestor and then establishes a data path connection between the requester corresponding to the request 250 and the requested memory bank 240. Although four different conductive lines 234, 214, 212, 244 are shown in FIG. 4, it should be readily apparent that any number of lines may be used.

In another aspect of this embodiment, the switch 110 is configured to support variable burst lengths and burst types. As described above, the burst length determines the maximum number of consecutive column locations that can be accessed for a given READ or WRITE command without the need to use clock cycles to transfer subsequent intervening column addresses. A burst type provides for either sequential and interleaved burst access.

Figure 5:
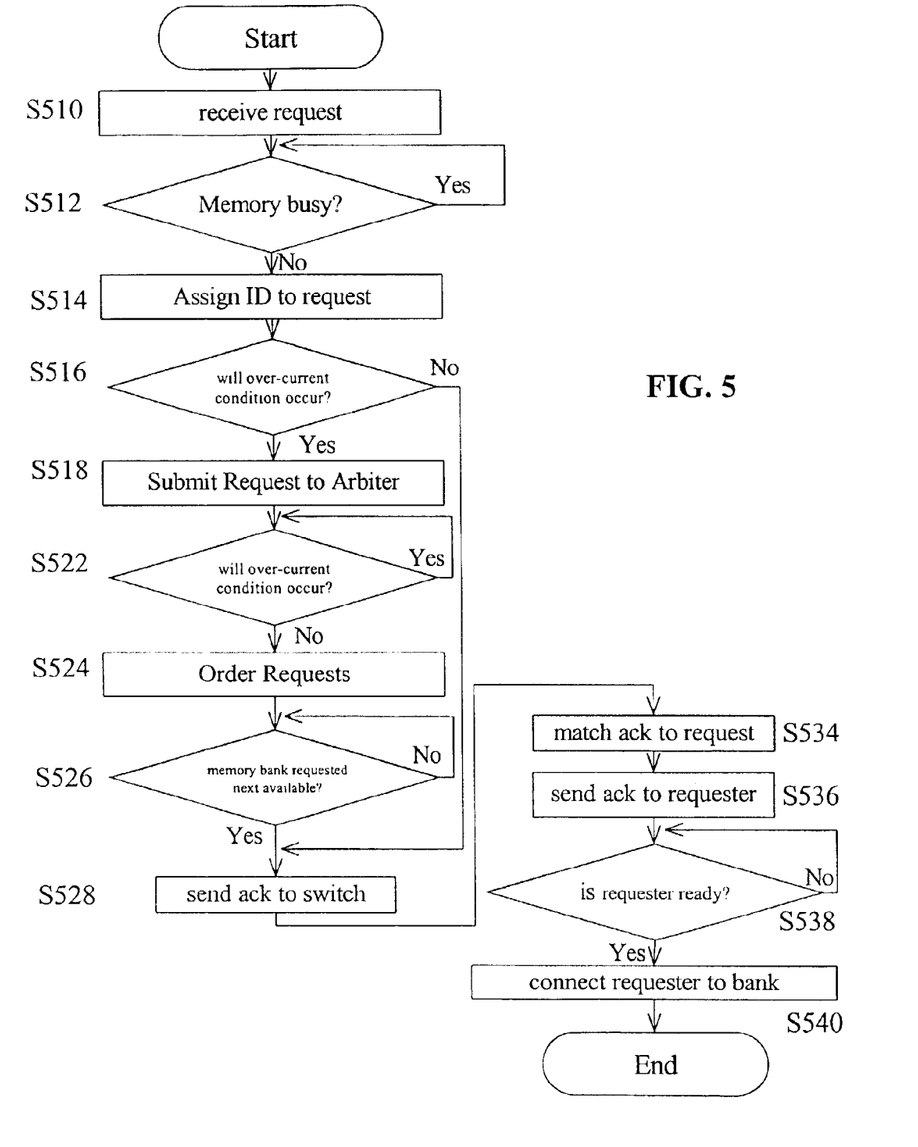
FIG. 5 is a flow chart depicting an operational flow of the FIG. 4 device, in accordance with an exemplary embodiment of the invention.

Turning now to FIG. 5, a flow chart is illustrated as depicting an operational flow of the FIG. 4 device in accordance with an exemplary embodiment of the invention. At process segment S510, a request 250 (FIG. 4) is received by switch 210. At process segment S512, the switch 210 determines which memory bank 240 is desired and samples the communication pathway from arbiter 220 that indicates the status of the memory bank 240. If the memory bank 240 is currently activated for a refresh, or read or write operation, then the memory bank 240 is BUSY, as indicated by a signal sent from the arbiter 220 to the switch 210 that indicates BUSY, then the request 250 is placed in buffer and the request is attempted a predetermined time later, and process execution proceeds to segment S512. If there is not a BUSY signal on the communication pathway from the arbiter 220 then process execution proceeds to segment S514. At process segment S514, the switch 210 assigns an identifier to the REQUEST (arbiter) that identifies it with the request 250 and the memory bank 240 desired.

At process segment S516, the switch 210 determines if permission is granted by the arbiter 220 to access the memory bank 240, (i.e., the switch 210 polls the communication pathways 214 from arbiter 220 for an ACCESS signal. The arbiter 220 continuously monitors the existing current demand. If the arbiter 220 determines that an over-current condition will not occur with the desired memory access, the arbiter 220 sends a grant of permission, i.e., sends an ACCESS to the switch 220 to access the memory bank 240. If switch 210 determines that the arbiter 240 has granted permission to access the memory bank 240, i.e., that there is an ACCESS signal from arbiter 220, then execution continues to process segment S528. If switch 210 determines that the arbiter 240 has not granted permission to access the memory bank 240, e.g., there is not an ACCESS signal from arbiter 220, then execution continues to process segment S518. In Step S518, the switch 210 issues the REQUEST (arbiter) to the arbiter 220 indicating a desire to access the memory bank 240.

At process segment S522, if the arbiter 220 determines that the activation of the memory bank 240 will cause an over-current condition to occur, the execution loops back to segment S522. If the arbiter 220 determines an over-current condition will not occur, the execution continues to process segment S524. In segment S524, the arbiter 220 determines the processing order, based on a predetermined prioritizing ordering method, of the REQUEST (arbiter) signals currently pending with the arbiter 220. At process segment S526, the arbiter 220 determines, based on the results of segment S524 if the REQUEST (arbiter) signal is the next permissible signal. If it is, then execution continues to process segment S528. If the REQUEST (arbiter) signal is not the next signal to be processed, then execution returns to process segment S526.

If process segment S526 or S516 indicates an access to the memory bank is permitted then in process segment S528 the arbiter 220 sends an ACKNOWLEDGE (arbiter) signal to the switch 210 granting access to the memory bank 240. In process segment S534, the switch 210 matches the acknowledged signal with the original request 250.

At process segment S536, the switch 210 sends an ACKNOWLEDGE (requester) signal to the requestor. At process segment S538, the switch 210 waits to receive an acknowledgment from the requestor When the switch 210 does receive an acknowledgement, then execution continues to process segment S540, where the switch 210 connects the requestor to the requested memory bank 240.

The above-described method follows a single request 250 for access to a single memory bank 240. Similar requests for other memory banks occur contemporaneously. Furthermore, the arbiter 220 continuously monitors current consumption in the memory banks 240, independent of the process steps indicated above for a request to be granted.

While the invention has been described and illustrated with reference to specific exemplary embodiments, it should be understood that many modifications and substitutions can be made without departing from the spirit and scope of the invention. Although the embodiments discussed above describe specific numbers of switches, communication and data pathways, memory banks, local memory controllers, and activate arbiters, the present invention is not so limited. In addition, although operational flows of embodiments of the invention have been depicted in connection with flow charts, it should be readily understood that the particular order of the operations described therein is not necessarily critical, and may be modified to combine, eliminate or further separate the process segments and still maintain the spirit of the invention. Furthermore, although the invention has been described for use in memory systems utilizing embedded DRAM memory, the invention may be utilized in any memory system that employs multiple memory arrays or banks. Accordingly, the invention is not to be considered as limited by the foregoing description but is only limited by the scope of the claims.

What is claimed as new and desired to be protected by Letters Patent of the United States is:

1. A device for controlling over current conditions in a semiconductor memory circuit, comprising:
    a memory array; and
    a first circuit for controlling memory requests to said memory array in accordance with current consumption within said memory array.

2. The device of claim 1, wherein said memory array comprises a plurality of memory banks.

3. The device of claim 2, further comprising:
    a second circuit coupled to a memory bank within said memory array and said first circuit, said second circuit monitoring the status of and controls access to said memory bank.

4. The device of claim 3, further comprising:
    a third circuit coupled to said memory bank and adapted to receive a request signal from a requestor requesting access to said memory bank, said third circuit directing said request signal to a selected second circuit.

5. The device of claim 4, wherein said first circuit is adapted to send an enable signal to permit access to said memory bank to said second circuit depending on an expected current consumption compared with a predetermined over-current level.

6. The device of claim 5, wherein said first circuit is adapted to send an enable signal to permit access to said memory bank to said second circuit depending on a predetermined ordering scheme.

7. The device of claim 6, wherein said second circuit is adapted to acknowledge said request signal depending on whether said memory bank outputs a busy signal and whether said first circuit has sent said enable signal to said second circuit.

8. The device of claim 7, wherein said third circuit is adapted to match said second circuit acknowledgement with said requesting signal.

9. The device of claim 8, wherein said third circuit is adapted to couple said matched requesting signal with said selected memory bank.

10. The device of claim 9, wherein said memory bank is adapted to output a busy signal to said second circuit if said memory bank is currently being accessed for another operation.

11. The device of claim 10, wherein said memory bank outputs a busy signal to said second circuit if said memory bank is being refreshed.

12. The device of claim 6, wherein said ordering scheme is a random ordering scheme.

13. The device of claim 6, wherein said ordering scheme is a round robin ordering scheme.

14. The device of claim 11, wherein said ordering scheme is a random ordering scheme.

15. The device of claim 11, wherein said ordering scheme is a round robin ordering scheme.

16. The device of claim 8, wherein said third circuit coordinates access to said memory array for burst type access.

17. The device of claim 2, further comprising:
    a second circuit coupled to said memory bank and adapted to receive a signal from a requestor requesting access to said memory bank, said second circuit directing said signal to said first circuit.

18. The device of claim 17, wherein said first circuit is adapted to send an enable signal to said second circuit depending on an expected current consumption compared with a predetermined over current level.

19. The device of claim 18, wherein said first circuit is adapted to send an enable signal to said second circuit depending on a predetermined ordering scheme.

20. The device of claim 19, wherein said first circuit is adapted to acknowledge said requesting signal depending on whether said memory bank outputs a busy signal and whether said first circuit has sent said enable signal to said second circuit.

21. The device of claim 20, wherein said second circuit is adapted to match said first circuit acknowledgement with said requesting signal.

22. The device of claim 21, wherein said second circuit is adapted to couple said matched requesting signal with said selected memory bank.

23. The device of claim 22, wherein said memory bank is adapted to output a busy signal if said memory bank is currently being accessed for a read or write operation.

24. The device of claim 23, wherein said memory bank outputs a busy signal while said memory bank is being refreshed.

25. The device of claim 19, wherein said ordering scheme is a random ordering scheme.

26. The device of claim 19, wherein said ordering scheme is a round robin ordering scheme.

27. The device of claim 24, wherein said ordering scheme is a random ordering scheme.

28. The device of claim 24, wherein said ordering scheme is a round robin ordering scheme.

29. The device of claim 21, wherein said fourth circuit coordinates access to said memory array for burst type access.

30. A device for preventing over current conditions in a memory circuit, comprising:
    a memory array;
    a first circuit for controlling memory requests to said memory array in accordance with current consumption within said memory array;
    a second circuit coupled to a memory bank within said memory array and said first circuit, said second circuit being configured to monitor states of and control access to said memory bank; and
    a third circuit coupled to said memory bank and adapted to receive a request signal from a requestor requesting access to said memory bank, said third circuit directing said request signal to a selected second circuit.

31. The device of claim 30, wherein said first circuit enables access to said memory bank depending on whether a level of said current consumption is below a predetermined level.

32. The device of claim 31, wherein said first circuit enables access to said memory bank depending on a predetermined ordering scheme.

33. A method for controlling an over-current condition in a memory array, the method comprising:
receiving a memory request to access a memory bank of said memory array; and
controlling said memory request in accordance with current consumption within said memory array.

34. The method of claim 33, wherein said act of receiving further comprises:
determining whether said memory bank is busy.

35. The method of claim 34, wherein said act of determining further comprises:
transmitting an access request signal to said memory bank from a first circuit coupled to said memory bank; and
receiving an acknowledgment signal from said memory bank at said circuit.

36. The method of claim 33, wherein said act of controlling comprises:
receiving said memory request at said second circuit coupled to said memory bank;
determining whether granting said memory request will place said memory array into said over-current condition; and
granting said memory request if said request will not place said memory array into said over-current condition.

37. The method of claim 34, further comprising:
submitting a controller request to a controller, if said act of determining indicates that the memory bank is not busy.

38. The method of claim 37, wherein said act of controlling further comprises:
enabling an ACCESS signal depending on a current consumption compared with a pre-determined over-current level.

39. The method of claim 38, further comprising:
determining if an ACCESS signal has been enabled and acknowledging said controller request if it has and submitting an arbiter request to an arbiter if it has not.

40. The method of claim 39, wherein said controlling further comprises:
processing said pending arbiter requests depending on whether any said arbiter requests are pending and on a current consumption compared with a predetermined over-current level.

41. The method of claim 40, wherein said processing further comprises:
prioritizing said pending arbiter requests based on a predetermined ordering scheme; and
acknowledging said arbiter request depending on said ordering.

42. The method of claim 41, further comprising:
acknowledging said controller request depending on whether said arbiter request has been acknowledged.

43. The method of claim 42, further comprising:
acknowledging said memory bank request depending on whether said controller request has been acknowledged.

44. The method of claim 43, wherein said predetermined ordering is a random access ordering scheme.

45. The method of claim 43, wherein said predetermined ordering is a random access ordering scheme.

46. The method of claim 43, wherein said predetermined ordering is a round robin ordering scheme.

47. A semiconductor memory chip, comprising
a memory array;
a first circuit for controlling memory requests to said memory array in accordance with current consumption within said memory array;
a second circuit coupled to a memory bank within said memory array and said first circuit, said second circuit being configured to monitor states of and control access to said memory bank; and
a third circuit coupled to said memory bank and adapted to receive a request signal from a requestor requesting access to said memory bank, said third circuit directing said request signal to a selected second circuit.

48. The device of claim 47, wherein said first circuit enables access to said memory bank depending on whether a level of said current consumption is below a predetermined level.

49. The device of claim 48, wherein said first circuit enables access to said memory bank depending on a predetermined ordering scheme.

50. A processor system, comprising:
a central processing unit;
a memory component coupled to said processor, said memory component containing a device for preventing over current conditions in a memory circuit, comprising:
a memory array;
a first circuit for controlling memory requests to said memory array in accordance with current consumption within said memory array;
a second circuit coupled to a memory bank within said memory array and said first circuit, said second circuit being configured to monitor states of and control access to said memory bank; and
a third circuit coupled to said memory bank and adapted to receive a request signal from a requestor requesting access to said memory bank, said third circuit directing said request signal to a selected second circuit.

51. The device of claim 50, wherein said first circuit enables access to said memory bank depending on whether a level of said current consumption is below a predetermined level.

52. The device of claim 51, wherein said first circuit enables access to said memory bank depending on a predetermined ordering scheme.

* * * * *